United States Patent
Cha et al.

(10) Patent No.: US 8,404,576 B2
(45) Date of Patent: *Mar. 26, 2013

(54) METHODS OF FORMING A GATE STRUCTURE

(75) Inventors: Tae-Ho Cha, Gyeonggi-do (KR); Seong-Hwee Cheong, Seoul (KR); Gil-Heyun Choi, Seoul (KR); Byung-Hee Kim, Seoul (KR); Hee-Sook Park, Seoul (KR); Jong-Min Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 142 days.

This patent is subject to a terminal disclaimer.

(21) Appl. No.: 13/053,923

(22) Filed: Mar. 22, 2011

(65) Prior Publication Data

US 2011/0171818 A1 Jul. 14, 2011

Related U.S. Application Data

(63) Continuation of application No. 12/428,303, filed on Apr. 22, 2009, now Pat. No. 7,928,498.

(30) Foreign Application Priority Data

Apr. 23, 2008 (KR) .................. 10-2008-0037556

(51) Int. Cl.
*H01L 21/283* (2006.01)

(52) U.S. Cl. ........ 438/593; 438/257; 438/264; 438/266; 438/594

(58) Field of Classification Search .................. 438/257, 438/264, 266, 593, 594

See application file for complete search history.

(56) References Cited

U.S. PATENT DOCUMENTS

| | | | |
|---|---|---|---|
| 5,247,198 A | 9/1993 | Homma et al. | |
| 5,349,221 A | 9/1994 | Shimoji | |
| 7,101,777 B2 | 9/2006 | Ho et al. | |
| 7,928,498 B2 * | 4/2011 | Cha et al. ................ | 257/316 |
| 2005/0110058 A1 | 5/2005 | Hu | |
| 2005/0157549 A1 | 7/2005 | Mokhlesi et al. | |
| 2006/0027882 A1 | 2/2006 | Mokhlesi | |
| 2007/0001246 A1 | 1/2007 | Lim et al. | |

FOREIGN PATENT DOCUMENTS

| | | |
|---|---|---|
| CN | 1938786 A | 3/2007 |
| KR | 10-0673902 | 1/2007 |
| KR | 10-0681211 | 2/2007 |

* cited by examiner

*Primary Examiner* — Calvin Lee
*Assistant Examiner* — Scott Stowe
(74) *Attorney, Agent, or Firm* — Myers Bigel Sibley & Sajovec, P.A.

(57) ABSTRACT

A gate structure includes an insulation layer on a substrate, a first conductive layer pattern on the insulation layer, a metal ohmic layer pattern on the first conductive layer pattern, a diffusion reduction layer pattern on the metal ohmic layer pattern an amorphous layer pattern on the diffusion reduction layer pattern, and a second conductive layer pattern on the amorphous layer pattern. The gate structure may have a low sheet resistance and desired thermal stability.

3 Claims, 11 Drawing Sheets

METHODS OF FORMING A GATE STRUCTURE

CROSS-REFERENCE TO RELATED APPLICATION

This application is a continuation of U.S. patent application Ser. No. 12/428,303, filed Apr. 22, 2009 now U.S. Pat. No. 7,928,498, which claims priority under 35 U.S.C. §119 to Korean patent Application No. 2008-37556, filed on Apr. 23, 2008, the disclosures of which are hereby incorporated by reference in their entireties.

BACKGROUND

1. Field

Example embodiments relate to a gate structure in a semiconductor device and a method of forming a gate structure in a semiconductor device. More particularly, example embodiments relate to a multi-layered gate structure and a method of forming the gate structure.

2. Description of Related Art

A conventional gate electrode is usually formed using polysilicon doped with impurities. As a semiconductor device is highly integrated, the gate electrode of polysilicon may not be properly employed in the semiconductor device because polysilicon has a relatively high resistance. Accordingly, a gate electrode having a polycide structure has been developed, which has a resistance lower than that of polysilicon. The conventional gate electrode having the polycide structure generally includes a polysilicon film and a metal silicide film formed on the polysilicon film. Here, a titanium silicide film or a tungsten silicide film may be usually used as the metal silicide film. However, the conventional gate electrode having the polycide structure may not meet the desired resistance of the semiconductor device according as the semiconductor device has an extremely high integration degree while ensuring adequate electrical characteristics of the semiconductor device, Recently, a gate electrode has been developed to include a polysilicon film and a metal film provided on the polysilicon film to reduce the resistance of the gate electrode. Here, an ohmic film and a barrier film should be provided between the polysilicon film and the metal film because the metal film may be changed into a metal silicide film when the metal film is directly formed on the polysilicon film.

In the conventional gate electrode, the metal film, the barrier film and the ohmic film generally include tungsten, tungsten nitride and tungsten silicide, respectively. However, nitrogen included in the barrier film may be decomposed from tungsten nitride and combined with silicon in the ohmic layer during high temperature processes for forming the gate electrode. Thus, an irregular interface of silicon nitride may be generated between the barrier film and the ohmic film, to thereby considerably increase the resistance of the gate electrode.

FIG. 1 is a scanning electron microscope (SEM) picture illustrating the irregular interface caused by the agglomeration of silicon nitride in the conventional gate electrode. In FIG. 1, the conventional gate electrode includes a polysilicon film, a tungsten silicide film, a tungsten nitride film and a tungsten film sequentially stacked on a substrate.

Referring to FIG. 1, the irregular interface is easily generated between the tungsten nitride film and the tungsten silicide film during the high temperature processes for forming the conventional gate electrode because of the agglomeration of silicon nitride.

Considering the above-mentioned problems, titanium silicide or titanium has been used as the ohmic film in the gate electrode instead of tungsten silicide.

FIG. 2 is an SEM picture illustrating a relatively uniform interface in another conventional gate electrode having the ohmic film of titanium. In FIG. 2, the conventional gate electrode includes a titanium film, a tungsten nitride film and a tungsten film successively formed on a substrate.

As illustrated in FIG. 2, the interface generated between the tungsten nitride film and the titanium film is relatively uniform after performing high temperature processes. However, the gate electrode including the ohmic film of titanium has a sheet resistance larger than greater than about 80% compared with that of the gate electrode including the ohmic film of tungsten silicide because the grain sizes of tungsten in the tungsten film becomes small due to the titanium film when the tungsten nitride film and the tungsten film are formed on the titanium film. Hence, the gate electrode including the ohmic film of titanium or titanium nitride has a relatively high sheet resistance, so that the semiconductor device including the gate electrode may not have desired electrical characteristics.

SUMMARY

In some embodiments according to the inventive concept, a method of forming a gate structure is provided. Pursuant to these embodiments, an insulation layer can be formed on a substrate, and a first conductive layer pattern can be formed on the insulation layer. After forming the metal ohmic layer pattern on the first conductive layer pattern, a diffusion preventing layer pattern can be formed on the metal ohmic layer pattern. An amorphous layer pattern can be formed on the diffusion preventing layer pattern, and then a second conductive layer pattern can be formed on the amorphous layer pattern.

In example embodiments, the second conductive layer pattern may be formed using tungsten, and the amorphous layer pattern may be formed using tungsten silicide. Additionally, the diffusion preventing layer pattern may be formed using tungsten nitride.

In example embodiments, the metal ohmic layer pattern may be formed using titanium.

In example embodiments, impurities may be further implanted into the amorphous layer pattern to improve amorphous characteristics of the amorphous layer pattern.

According to still another aspect of example embodiments, there is provided a method of forming a gate structure. In the method of forming the gate structure, a tunnel insulation layer is formed on a substrate, and a floating gate is formed on the tunnel insulation layer. A dielectric layer pattern is formed on the floating gate, and a control gate is formed on the dielectric layer pattern. In the formation of the control gate, a first conductive layer pattern is formed on the dielectric layer pattern, and the metal ohmic layer pattern is formed on the first conductive layer pattern. Further, a diffusion preventing layer pattern is formed on the metal ohmic layer pattern, an amorphous layer pattern is formed on the diffusion preventing layer pattern, and a second conductive layer pattern is formed on the amorphous layer pattern.

In example embodiments, the second conductive layer pattern may be formed using tungsten, and the amorphous layer pattern may be formed using tungsten silicide. Additionally, the diffusion preventing layer pattern may be formed using tungsten nitride, and the metal ohmic layer pattern may be formed using titanium.

In the formation of the floating gate, an additional first conductive layer pattern may be formed on the tunnel insulation layer, and an additional metal ohmic layer pattern may be formed on the additional first conductive layer pattern. After forming an additional diffusion preventing layer pattern on the additional metal ohmic layer pattern, an additional amorphous layer pattern may be formed on the additional diffusion preventing layer pattern. An additional second conductive layer pattern may be formed on the additional amorphous layer pattern. Here, the additional first conductive layer pattern may be formed using polysilicon, and the additional second conductive layer pattern may be formed using tungsten. In addition, the additional amorphous layer pattern may be formed using tungsten silicide, and the additional diffusion preventing layer pattern may be formed using tungsten nitride.

According to example embodiments, the gate structure includes the amorphous layer pattern between the second conductive layer pattern and the diffusion preventing layer pattern, so that the gate structure may have a low sheet resistance and a uniform interface between the second conductive layer pattern and the diffusion preventing layer pattern. When the gate structure is employed in a semiconductor device, the semiconductor device may have desired electric characteristics, for example, a high response speed, an improved reliability, a lower power consumption, etc.

BRIEF DESCRIPTION OF THE DRAWINGS

Example embodiments will be more clearly understood from the following detailed description taken in conjunction with the accompanying drawings.

FIG. 1 is a scanning electron microscope (SEM) picture illustrating an irregular interface caused by the agglomeration of silicon nitride in a conventional gate electrode.

FIG. 2 is a SEM picture illustrating a relatively uniform interface in another conventional gate electrode, FIG. 3 is a cross-sectional view illustrating a gate structure in accordance with example embodiments.

FIG. 4 is a graph illustrating sheet resistances of gate structures in accordance with example embodiments.

FIG. 5 is a graph illustrating sheet resistances of gate structures relative to weight ratios of nitrogen in accordance with some example embodiments.

FIG. 6 is a graph illustrating inversion capacitances of gate structures in accordance with example embodiments.

FIG. 7 is a cross-sectional view illustrating another gate structure in accordance with example embodiments.

FIG. 8 is a cross-sectional view illustrating still another gate structure in accordance with example embodiments.

FIGS. 9 to 13 are cross-sectional views illustrating a method of manufacturing a gate structure in accordance with example embodiments.

FIGS. 14 to 16 are cross-sectional views illustrating another method of manufacturing a gate structure in accordance with example embodiments.

FIGS. 17 to 19 are cross-sectional views illustrating still another method of manufacturing a gate structure in accordance with example embodiments.

FIG. 20 is a cross-sectional view illustrating a volatile semiconductor device having a gate structure in accordance with example embodiments.

FIG. 21 is a cross-sectional view illustrating a non-volatile semiconductor device having a gate structure in accordance with example embodiments.

FIG. 22 is a cross-sectional view illustrating another non-volatile semiconductor device having a gate structure in accordance with example embodiments.

DESCRIPTION OF EMBODIMENTS

Figure 1:
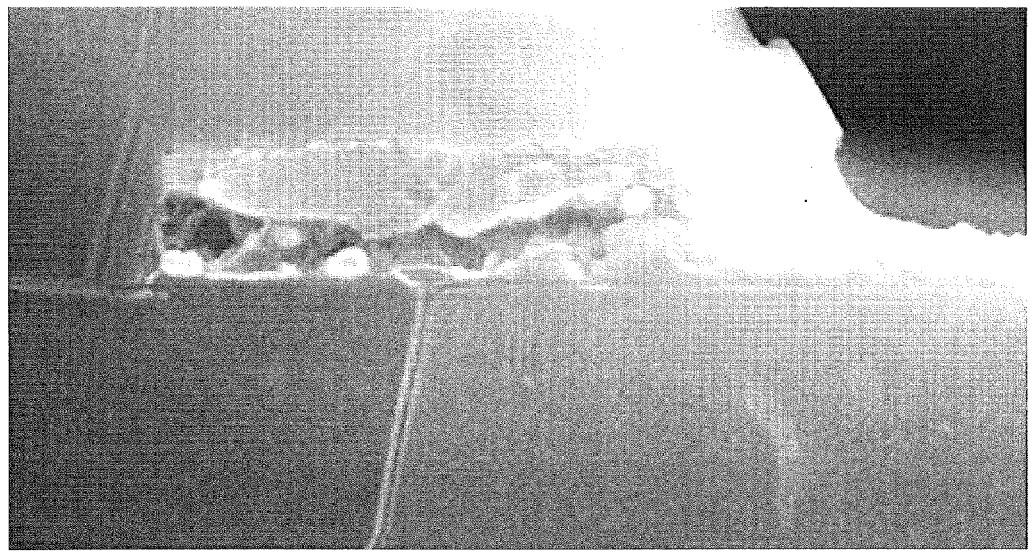
FIGS. 1 to 22 represent non-limiting, example embodiments as described herein.

Various example embodiments will be described more fully hereinafter with reference to the accompanying drawings, in which some example embodiments are shown. The invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
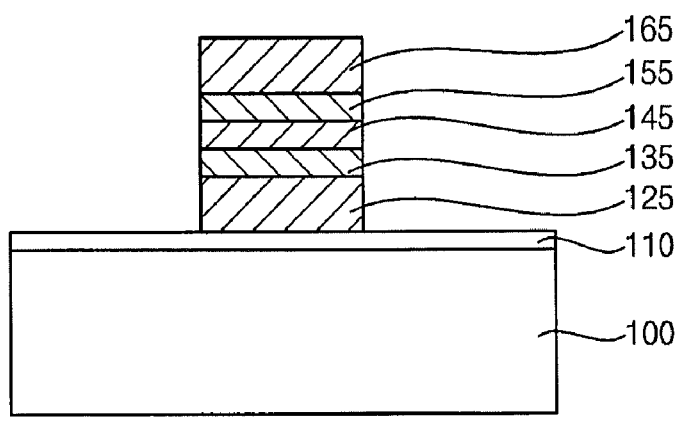

FIG. 3 is a cross-sectional view illustrating a gate structure in accordance with examples embodiments.

Referring to FIG. 3, the gate structure may include a gate insulation layer 110, a first conductive layer pattern 125, a metal ohmic layer pattern 135, a diffusion preventing layer pattern 145, an amorphous layer pattern 155, and a second conductive layer pattern 165.

The gate structure is provided on a substrate 100. The substrate 100 may include a semiconductor substrate such as a silicon (Si) substrate, a germanium (Ge) substrate, a silicon-germanium (Si—Ge) substrate, etc. Alternatively, the substrate 100 may include a silicon-on-insulator (SOI) substrate, a germanium-on-insulator (GOI) substrate, etc.

In example embodiments, the substrate 100 may have a well containing P type or N type impurities. Namely, the P type or the N type impurities may be doped with into the substrate 100 to provide the well at a desired portion of the substrate 100.

The gate insulation layer 110 may include oxide or metal oxide having a high dielectric constant. For example, the gate insulation layer 110 may include silicon oxide (SiOx), hafnium oxide (HfOx), zirconium oxide (ZrOx), tantalum oxide (TaOx), aluminum oxide (AlOx), etc. These may be used alone or in a combination thereof.

The first conductive layer pattern 125 may include polysilicon doped with impurities. For example, the first conductive layer pattern 125 may include polysilicon doped with P type impurities. Here, the P type impurities may include boron (B), indium (In), gallium (Ga), etc. Alternatively, the first conductive layer pattern 125 may include polysilicon doped with N type impurities such as phosphorus (P), arsenic (As), antimony (Sn), etc.

In some example embodiments, the first conductive layer pattern 125 may include metal and/or metal compound. For example, the first conductive layer pattern 125 may include tungsten (W), titanium (Ti), aluminum (Al), nickel (Ni), tantalum (Ta), tungsten nitride (WNx), tungsten silicide (WSix), titanium nitride (TiNx), titanium silicide (TiSix), aluminum nitride (AlNx), titanium aluminum nitride (TiAlxNy), nickel silicide (NiSix), cobalt silicide (CoSix), etc. These may be used alone or in a combination thereof.

The metal ohmic layer pattern 135 may include metal having a low resistivity and a high melting point. For example, the metal ohmic layer pattern 135 may include titanium, tantalum, tungsten, molybdenum (Mo), etc. Alternatively, the metal ohmic layer pattern 135 may include an alloy containing at least one of titanium, tantalum, tungsten and molybdenum. The metal ohmic layer pattern 135 may prevent an increase of an interfacial resistance between the first conductive layer pattern 125 and the second conductive layer pattern 165. In example embodiments, the metal ohmic layer pattern 135 may have a thickness below about 50 Å based on an upper face of the first conductive layer pattern 125.

It will be understood that, as used herein the term "ohmic layer" refers to layers where an impedance associated therewith is substantially given by the relationship of Impedance=V/I, where V is a voltage across the layer and I is the current, at substantially all expected operating frequencies (i.e., the impedance associated with the ohmic layer is substantially the same at all operating frequencies). For example, in some embodiments according to the invention, an ohmic layer pattern can have a specific resistivity of less than about 10 e-03 ohm-cm$^2$ and, in some embodiments less than about 10 e-04 ohm-cm$^2$. Thus, a material that is rectifying or that has a high specific resistivity, for example, a specific resistivity of greater than about 10 e-03 ohm-cm$^2$, is not an ohmic layer as that term is used herein.

The diffusion preventing layer pattern 145 may prevent or even considerably reduce impurities included in the first conductive layer pattern 125 from diffusing into the second conductive layer pattern 165. The diffusion preventing layer pattern 145 may include metal nitride. For example, the diffusion preventing layer pattern 145 may include tungsten nitride, titanium nitride, tantalum nitride, molybdenum nitride, aluminum nitride, etc. These may be used alone or in a mixture thereof. In example embodiments, the metal included in the diffusion preventing layer pattern 145 may be substantially the same or substantially similar to that in the metal ohmic layer pattern 135, In some example embodiments, the diffusion preventing layer pattern 145 may include tungsten nitride represented by a chemical formula of WNx. Here, x may be in a range of about 0.2 to about 0.9. When the content of nitrogen in the diffusion preventing layer pattern 145 is in this range, the diffusion preventing layer pattern 145 may be have a good thermal stability. Additionally, a weight ratio of nitrogen in the diffusion preventing layer pattern 145 relative to metal may vary in accordance with the electrical characteristics of the gate structure. For example, the weight ratio of nitrogen in the diffusion preventing layer pattern 145 may be in a range substantially greater than about 20 percent by weight.

The amorphous layer pattern 155 may include amorphous silicon or amorphous metal silicide having a high melting point. When the amorphous layer pattern 155 includes amorphous metal silicide, the gate structure may have a relatively low contact resistance. In example embodiments, the amorphous layer pattern 155 may include amorphous tungsten silicide (WSix), amorphous titanium silicide (TiSix), amorphous molybdenum silicide (MoSix), amorphous tantalum silicide (TaSix), etc. These may be used alone or in a mixture thereof. For example, the amorphous layer pattern 155 may include amorphous tungsten silicide and one of amorphous titanium silicide, amorphous molybdenum silicide and amorphous tantalum silicide.

The amorphous layer pattern 155 may prevent the sheet resistance of the second conductive layer pattern 165 from being increased due to the metal ohmic layer pattern 135 containing metal. For example, the amorphous layer pattern 155 may prevent the grain size of tungsten in the second conductive layer pattern 165 from being reduced when the metal ohmic layer pattern 135 includes titanium. Accordingly, the second conductive layer pattern 165 may have a reduced sheet resistance.

The second conductive layer pattern 165 may include metal having a high melting point, so that the second conductive layer pattern 165 may endure with respect to a heat treatment process performed at a high temperature. For example, the second conductive layer pattern 165 may include tungsten, titanium, tantalum, tungsten, molybdenum, nickel, aluminum, etc. Alternatively, the second conductive layer pattern 165 may include an alloy containing at least one of tungsten, titanium, tantalum, tungsten, molybdenum, nickel and aluminum.

Electrical characteristics of the gate structure having the above-described structure will be described with reference to FIGS. 4 to 6.

Figure 4:
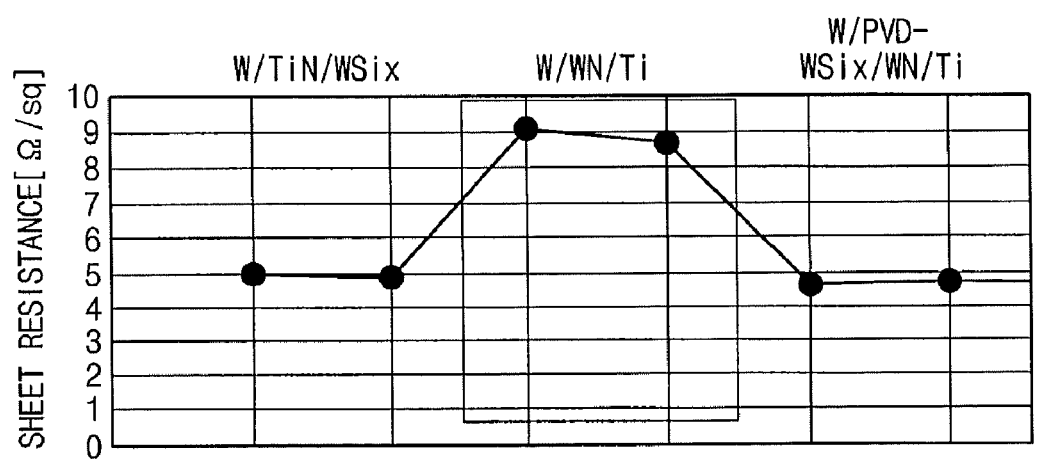

FIG. 4 is a graph illustrating sheet resistances of gate structures in accordance with example embodiments. In FIG. 4, a first gate structure includes a tungsten silicide layer pattern, a titanium nitride layer pattern and a tungsten layer pattern sequentially formed on a polysilicon layer pattern. Additionally, a second gate structure has a titanium layer pattern, a tungsten nitride layer pattern and a tungsten layer pattern successively stacked on a polysilicon layer pattern. Furthermore, a third gate structure includes a titanium layer pattern, a tungsten nitride layer pattern, a tungsten silicide layer pattern and a tungsten layer pattern sequentially stacked on a polysilicon layer pattern. Here, the tungsten silicide layer pattern of the third gate structure is obtained by a physical vapor deposition (PVD) process.

Referring to FIG. 4, the third gate structure having the titanium, the tungsten nitride, the tungsten silicide and the tungsten layer patterns may a sheet resistance considerably lower than that of the second gate structure having the titanium, the tungsten nitride and the tungsten layer patterns. Further, the sheet resistance of the third gate structure may be greatly less than that of the first gate structure having the tungsten silicide, the titanium nitride and the tungsten layer patterns. Here, the second gate structure may have a sheet resistance substantially similar to that of the first gate structure.

Figure 5:
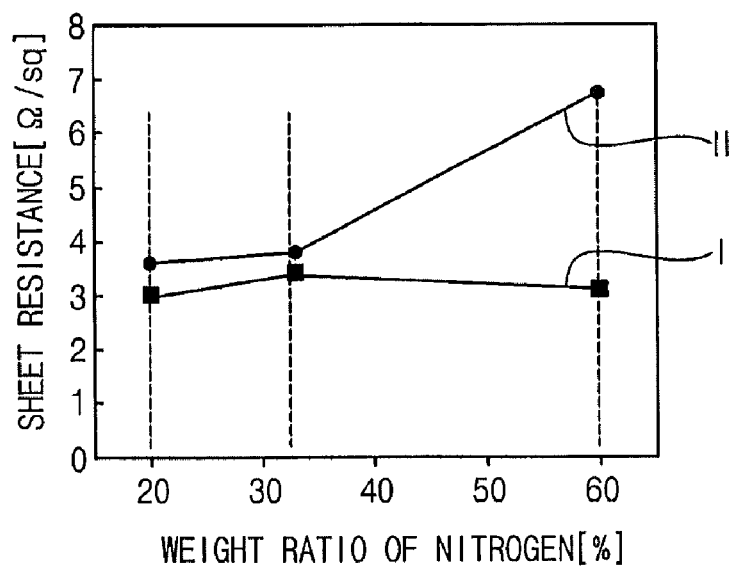

FIG. 5 is a graph illustrating sheet resistances of other gate structure relative to weight ratios of nitrogen in accordance with example embodiments. In FIG. 5, "I" indicates a sheet resistance of a fourth gate structure relative to a nitrogen content in the fourth gate structure, and "II" denotes a sheet resistance of a fifth gate structure with respect to a nitrogen content in the fifth gate structure. The fourth gate structure includes a tungsten nitride layer pattern, an amorphous tungsten silicide layer pattern and a tungsten layer pattern successively formed on a polysilicon layer pattern. The fifth gate structure has an amorphous tungsten silicide layer pattern, a tungsten nitride layer pattern and a tungsten layer pattern sequentially stacked on a polysilicon layer pattern.

As illustrated in FIG. 5, the fourth gate structure having the tungsten nitride, the amorphous tungsten silicide and the tungsten layer patterns may have a sheet resistance smaller than that of the fifth gate structure having the amorphous tungsten silicide, the tungsten nitride and the tungsten layer patterns. That is, when the fourth gate structure has the amorphous tungsten silicide layer pattern interposed between the tungsten nitride layer pattern and the tungsten layer pattern, the sheet resistance of the fourth gate structure may be less than that of the fifth gate structure having the amorphous tungsten silicide layer pattern formed beneath the tungsten nitride layer pattern. Thus, the grain sizes of metal in a conductive layer of metal may not be reduced when an amorphous metal silicide layer is positioned beneath the conductive layer of metal. Namely, the amorphous tungsten silicide layer pattern provided beneath the tungsten layer pattern may have a direct effect on the grain sizes of metal in the tungsten layer pattern. Furthermore, the sheet resistance of the fourth gate structure may become considerably lower than that of the fifth gate structure according as the weight ratios of nitrogen in the fourth and the fifth gate structures.

When the weight ratio of the nitrogen in the tungsten nitride layer pattern serving as the diffusion preventing layer pattern 145 is substantially greater than about 40%, the sheet resistance of the gate structure including the amorphous layer pattern 155 between the diffusion preventing layer 145 and the metal ohmic layer pattern 135 may be slightly reduced. However, the sheet resistance of the gate structure including the amorphous layer pattern 155 between the diffusion preventing layer pattern 145 and the second conductive layer pattern 165 may have a considerably reduced sheet resistance.

Figure 6:
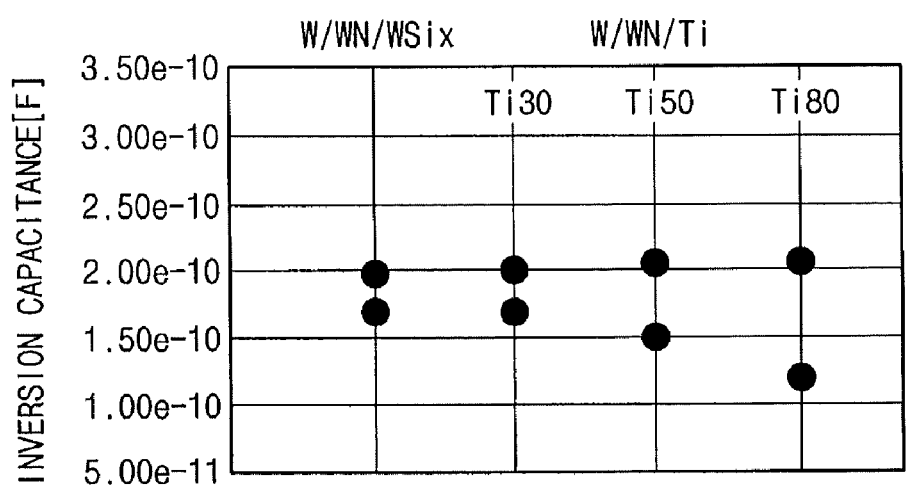

FIG. 6 is a graph illustrating inversion capacitances of gate structures in accordance with example embodiments. In FIG. 6, a sixth gate structure includes a tungsten silicide layer pattern, a tungsten nitride layer pattern and a tungsten layer pattern successively provided on a polysilicon layer pattern, and a seventh gate structure includes a titanium layer pattern, a tungsten nitride layer pattern and a tungsten layer pattern sequentially formed a polysilicon layer pattern.

Referring to FIG. 6, an inversion capacitance of the seventh gate structure including the titanium layer pattern, the tungsten nitride layer pattern and the tungsten layer pattern may decrease according as a thickness of the titanium layer pattern increases although the sixth gate structure including the tungsten silicide layer pattern, the tungsten nitride layer pattern and the tungsten layer pattern has relatively constant inversion capacitance. That is, when the thickness of the titanium layer pattern used as the metal ohmic layer pattern 135 increases, the inversion capacitance of the seventh gate structure may be deteriorated. Thus, the thickness of the titanium layer pattern may be adjusted to a proper value. In example embodiments, the thickness of the titanium layer pattern serving as the metal ohmic layer pattern 135 may be in a range below about 50 Å.

As described above, the gate structure according to example embodiments may include the amorphous layer pattern 155 provided between the diffusion preventing layer pattern 145 and the second conductive layer pattern 165, so that the gate structure may have a low sheet resistance for a semiconductor device required a high response speed. Additionally, the metal ohmic layer pattern 135 may include metal having a high melting point such as titanium and may have a desired thickness, such that the gate structure including the metal ohmic layer pattern 135 may have good thermal stability and electrical characteristics.

Figure 7:
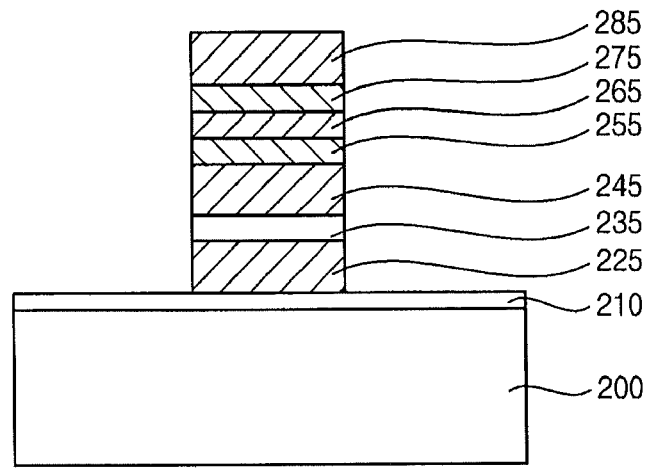

FIG. 7 is a cross-sectional view illustrating another gate structure in accordance with example embodiments.

Referring to FIG. 7, the gate structure is provided on a substrate 200. The gate structure includes a tunnel insulation layer 210, a floating gate 225, a dielectric layer pattern 235, a first conductive layer pattern 245, a metal ohmic layer pattern 255, a diffusion preventing layer pattern 265, an amorphous layer pattern 275, and a second conductive layer pattern 285, which are sequentially formed on the substrate 200.

In example embodiments, the first conductive layer pattern 245, the metal ohmic layer pattern 255, the diffusion preventing layer pattern 265, the amorphous layer pattern 275 and the second conductive layer pattern 285 may serve as a control gate in a non-volatile semiconductor device.

In some example embodiments, the floating gate 225 may include an additional first conductive layer pattern, an additional metal ohmic layer pattern, an additional diffusion preventing layer pattern, an additional amorphous layer pattern and an additional second conductive layer pattern. Here, the additional first conductive layer pattern, the additional metal ohmic layer pattern, the additional diffusion preventing layer pattern, the additional amorphous layer pattern and the additional second conductive layer pattern may include materials substantially the same as or substantially similar to those of the first conductive layer pattern 245, the metal ohmic layer pattern 255, the diffusion preventing layer pattern 265, the amorphous layer pattern 275 and the second conductive layer pattern 285, respectively.

The substrate 200 may include a silicon substrate, a germanium substrate, a silicon-germanium substrate, an SOI substrate, a GOI substrate, etc. In example embodiments, the substrate 200 may have a well formed by doping with P type impurities or N type impurities.

The tunnel insulation layer 210 is formed on the substrate 200 as an energy barrier layer for charges tunneling between the substrate 200 and the floating gate 225. The tunnel insulation layer 210 may include oxide such as silicon oxide, or oxynitride like silicon oxynitride. Alternatively, the tunnel insulation layer 210 may include silicon oxide doped with impurities or low dielectric material.

The floating gate 225 may store charges transferred from the substrate 200. The floating gate 225 may include polysilicon doped with impurities, metal and/or metal compound having a high work function. For example, the floating gate 225 may include tungsten, titanium, cobalt, nickel, tungsten nitride, tungsten silicide, titanium nitride, titanium silicide, cobalt silicide, nickel silicide, etc. These may be used alone or in a mixture thereof.

The dielectric layer pattern 235 may have an ONO structure that includes a lower oxide film, a nitride film and an upper oxide film. Here, the lower and the upper oxide films may include silicon oxide and the nitride film may include silicon nitride. Alternatively, the dielectric layer pattern 235 may include metal oxide having a high dielectric constant to increase a capacitance and to reduce a leakage current. Examples of the metal oxide in the dielectric layer pattern 235 may include hafnium oxide, titanium oxide, tantalum oxide, zirconium oxide, aluminum oxide, etc. These may be used alone or in a combination thereof.

The first conductive layer pattern 245 may include polysilicon doped with impurities. For example, the first conductive layer pattern 245 may include polysilicon doped with P type impurities such as boron, indium, gallium, etc. Alternatively, the first conductive layer pattern 245 may include polysilicon doped with N type impurities such as phosphorus, arsenic, antimony, etc. In some example embodiments, the first conductive layer pattern 245 may include metal and/or metal compound. For example, the first conductive layer pattern 245 may include tungsten, titanium, aluminum, nickel, tantalum, tungsten nitride, tungsten silicide, titanium nitride, titanium silicide, aluminum nitride, titanium aluminum nitride, nickel silicide, cobalt silicide, etc. These may be used alone or in a combination thereof.

The metal ohmic layer pattern 255 may include metal having a low resistivity and a high melting point such as titanium, tantalum, tungsten, molybdenum, etc. Alternatively, the metal ohmic layer pattern 255 may include an alloy containing at least one of titanium, tantalum, tungsten and molybdenum. The metal ohmic layer pattern 255 may prevent an interfacial resistance between the first conductive layer pattern 245 and the second conductive layer pattern 285 from being increased.

The diffusion preventing layer pattern 265 may include metal nitride such as tungsten nitride, titanium nitride, tantalum nitride, molybdenum nitride, aluminum nitride, etc. The diffusion preventing layer pattern 265 may prevent impurities included in the first conductive layer pattern 245 from diffusing into the second conductive layer pattern 285. In example embodiments, the metal included in the diffusion preventing layer pattern 265 may be substantially the same or substantially similar to that in the metal ohmic layer pattern 255.

The amorphous layer pattern 275 may include amorphous silicon or amorphous metal silicide having a high melting point such as amorphous tungsten silicide, amorphous titanium silicide, amorphous molybdenum silicide, amorphous tantalum silicide, etc. The amorphous layer pattern 275 may include composite material that contains one of amorphous tungsten silicide, amorphous titanium silicide, amorphous molybdenum silicide and amorphous tantalum silicide. The amorphous layer pattern 275 may prevent the increase of the sheet resistance of the second conductive layer pattern 285 caused by the metal ohmic layer pattern 255.

The second conductive layer pattern 285 may include metal that has a high melting point such as tungsten, titanium, tantalum, tungsten, molybdenum, nickel, aluminum, etc. Alternatively, the second conductive layer pattern 285 may include an alloy containing at least one of tungsten, titanium, tantalum, tungsten, molybdenum, nickel and aluminum. The second conductive layer pattern 285 may endure in a high temperature heat treatment process.

The gate structure according to example embodiments may serve as the control gate. The control gate may include the first conductive layer pattern 245, the metal ohmic layer pattern 265, the diffusion preventing layer pattern 265, the amorphous layer pattern 275 and the second conductive layer pattern 285. Accordingly, the gate structure serving as the control gate may have a low sheet resistance and a good thermal stability.

When the gate structure includes the first conductive layer pattern 225, the metal ohmic layer pattern 265, the diffusion preventing layer pattern 275 and the second conductive layer pattern 285, the gate structure may ensure desired thermal and electrical characteristics such as a low sheet resistance, an improved thermal stability, an enhanced reliability, etc.

Figure 8:
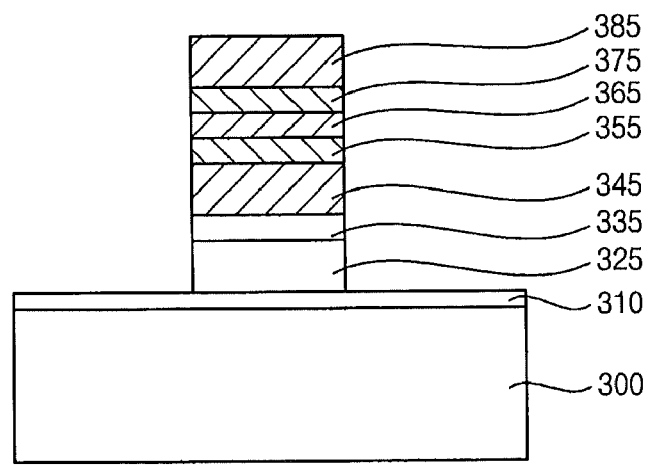

FIG. 8 is a cross-sectional view illustrating still another gate structure in accordance with example embodiments.

Referring to FIG. 8, the gate structure includes a tunnel insulation layer 310, a charge trapping layer pattern 325, a blocking layer pattern 335, a first conductive layer pattern 345, a metal ohmic layer pattern 355, a diffusion preventing layer pattern 365, an amorphous layer pattern 375, and a second conductive layer pattern 385, which are sequentially stacked on a substrate 300.

The first conductive layer pattern 345, the metal ohmic layer pattern 355, the diffusion preventing layer pattern 365, the amorphous layer pattern 375 and the second conductive layer pattern 385 may be substantially the same as or substantially similar to those described with reference to FIG. 3 or FIG. 7. Further, the first conductive layer pattern 345, the metal ohmic layer pattern 355, the diffusion preventing layer pattern 365, the amorphous layer pattern 375 and the second conductive layer pattern 385 may serve as a gate electrode in a semiconductor device.

The substrate 300 may include a semiconductor substrate or a substrate having a semiconductor layer such as an SOI substrate, a GOI substrate, etc. The tunnel insulation layer 310 may include oxide, oxynitride, silicon oxide doped with impurities, low dielectric material, etc. The tunnel insulation layer 310 may have a relatively thin thickness based on an upper face of the substrate 300.

The charge trapping layer pattern 325 may store charges moved from the substrate 300. The charge trapping layer pattern 325 may include nitride such as silicon nitride. Alternatively, the charge trapping layer pattern 325 may have a multi layer structure that includes at least one oxide film and at least one nitride film. For example, the charge trapping layer pattern 325 may include an oxide film and a nitride film sequentially formed on the tunnel insulation layer 310. Alternatively, the charge trapping layer pattern 325 may have a lower nitride film, an oxide film and an upper nitride film.

The blocking layer pattern 335 may include oxide such as silicon oxide. Alternatively, the blocking layer pattern 325 may include metal oxide having a high dielectric constant. For example, the blocking layer pattern 325 may include hafnium oxide, titanium oxide, tantalum oxide, zirconium oxide, aluminum oxide, etc.

According to example embodiments, the gate structure may also ensure a low sheet resistance and a good thermal stability as described above because the gate structure include the first conductive layer pattern 345, the metal ohmic layer pattern 355, the diffusion preventing layer pattern 365, the amorphous layer pattern 375 and the second conductive layer pattern 385 as described above.

FIGS. 9 to 13 are cross-sectional views illustrating a method of manufacturing a gate structure in accordance with example embodiments.

Figure 9:
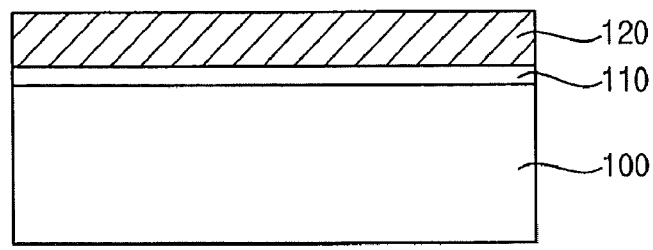

Referring to FIG. 9, a gate insulation layer 110 and a first conductive layer 120 are formed on a substrate 100. The substrate 100 may include a semiconductor substrate, an SOI substrate, a GOI substrate, etc. Impurities may be doped into a predetermined portion of the substrate 100 to form a well that contains the impurities. For example, P type or N type impurities may be doped with into the predetermined portion of the substrate 100 by an ion implantation process.

The gate insulation layer 110 may be formed by a chemical vapor deposition (CVD) process, an atomic layer deposition (ALD) process, a sputtering process, a thermal oxidation process, a pulsed laser deposition (PLD) process, etc. Further, the gate insulation layer 110 may be formed using oxide or metal oxide. For example, the gate insulation layer 110 may be formed using silicon oxide, hafnium oxide, zirconium oxide, tantalum oxide and/or aluminum oxide.

In example embodiments, the first conductive layer 120 may be formed using polysilicon by a CVD process, a plasma enhanced chemical vapor deposition (PECVD) process, a low pressure chemical vapor deposition (LPCVD) process, etc. When the first conductive layer 120 includes polysilicon, impurities may be doped into a preliminary polysilicon layer after the preliminary polysilicon layer is formed on the gate insulation layer 110. Alternatively, the impurities may be implanted into the preliminary polysilicon layer while forming the preliminary polysilicon layer on the gate insulation layer 110. For example, the impurities may be doped by an in-situ doping process. Here, the impurities may include P type impurities such as boron, indium, gallium, etc. Alternatively, the impurities may include N type impurities like phosphorus, arsenic, antimony, etc.

In some example embodiments, the first conductive layer 120 may be formed using metal and/or metal compound by a CVD process, an ALD process, a PLD process, a sputtering process, an evaporation process, etc. For example, the first conductive layer 120 may be formed using tungsten, titanium, aluminum, nickel, tantalum, tungsten nitride, tungsten silicide, titanium nitride, titanium silicide, aluminum nitride, titanium aluminum nitride, nickel silicide and/or cobalt silicide.

Figure 10:
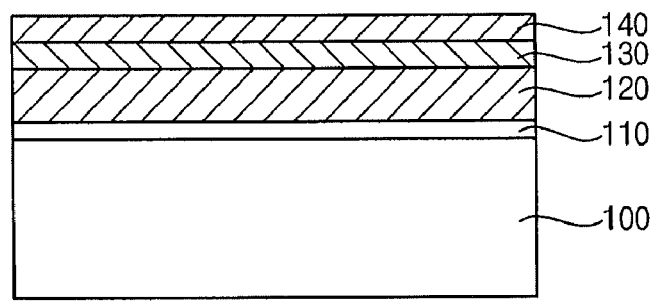

Referring to FIG. 10, a metal ohmic layer 130 and a diffusion preventing layer 140 are sequentially formed on the first conductive layer 120.

The metal ohmic layer 130 may be formed using metal having a low resistivity and a high melting point by a CVD process, an ALD process, a PLD process, a sputtering process, an evaporation process, a PECVD process, etc. For example, the metal ohmic layer 130 may be formed using titanium, tantalum, tungsten and/or molybdenum. Alternatively, the metal ohmic layer 130 may be formed using an alloy that includes at least one of titanium, tantalum, tungsten and molybdenum.

In example embodiments, the metal ohmic layer 130 may have a thin thickness below about 50 Å measured from an upper face of the first conductive layer 120. Additionally, a metal silicide film may be generated between the first conductive layer 120 and the metal ohmic layer 130 when metal in the metal ohmic layer 130 is reacted with silicon in the first conductive layer 120 while forming the metal ohmic layer 130 on the first conductive layer 120.

The diffusion preventing layer 140 may be formed using metal nitride by a CVD process, an ALD process, a sputtering process, a PECVD process, a PLD process, an evaporation process, etc. The diffusion preventing layer 140 may be formed using metal nitride in which the metal is substantially the same as that included in a second conductive layer 160 (see FIG. 12). Alternatively, the diffusion preventing layer 140 may be formed using metal nitride wherein the metal is substantially the same as that included in the metal ohmic layer 130. For example, the diffusion preventing layer 140 may be formed using tungsten nitride, titanium nitride, tantalum nitride, molybdenum nitride, aluminum nitride, etc.

In example embodiments, the diffusion preventing layer 140 may include tungsten nitride (WNx) in which a value of x may be in a range of about 0.2 to about 0.9. When the diffusion preventing layer 140 is formed using tungsten nitride, a weight ratio of nitrogen in tungsten nitride may vary considering electrical characteristics of the gate structure. For example, the weight ratio of nitrogen in the diffusion preventing layer 140 may be substantially greater than about 20 percent by weight. The diffusion preventing layer pattern 140 may prevent the impurities in the first conductive layer 120 from diffusing toward the second conductive layer 160 in successive processes.

Figure 11:
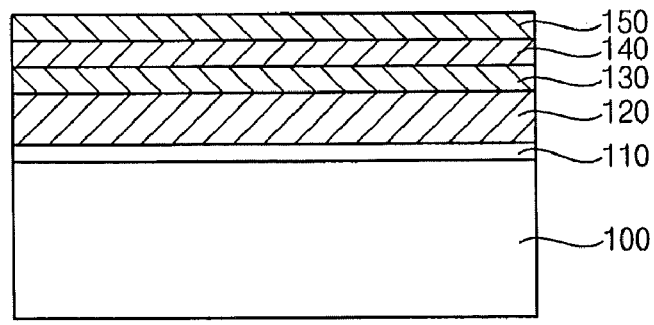

Referring to FIG. 11, an amorphous layer 150 is formed on the diffusion preventing layer 140. The amorphous layer 150 may be formed by a CVD process, an ALD process, a PECVD process, etc. Further, the amorphous layer 150 may be formed using amorphous silicon or amorphous metal silicide. For example, the amorphous layer 150 may be formed using amorphous tungsten silicide. In some example embodiments, the amorphous layer 150 may be formed using metal silicide having high melting point such as amorphous titanium silicide, amorphous molybdenum silicide, amorphous tantalum silicide and/or amorphous tungsten silicide.

In some example embodiments, impurities may be doped into the amorphous layer 150 to improve amorphous characteristics of the amorphous layer 150. Here, the impurities may include elements having relatively high molecular weights. For example, the impurities may include argon (Ar), neon (Ne), nitrogen, etc.

Figure 12:
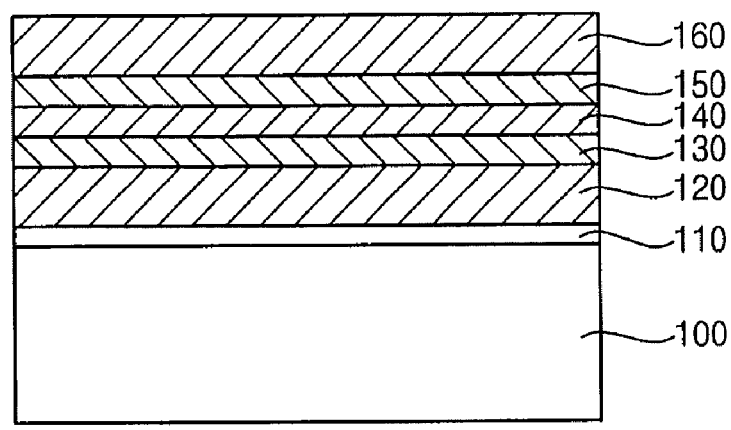

Referring to FIG. 12, the second conductive layer 160 is formed on the amorphous layer 150. The second conductive layer 160 may be formed using metal having a high melting point by a CVD process, a PECVD process, an ALD process, an evaporation process, a sputtering process, a PLD process, etc. For example, the second conductive layer 160 may be formed using tungsten, titanium, tantalum, molybdenum, etc. Alternatively, the second conductive layer 160 may be formed using an alloy that includes at least one of tungsten, titanium, tantalum, tungsten, molybdenum, nickel and aluminum.

Figure 13:
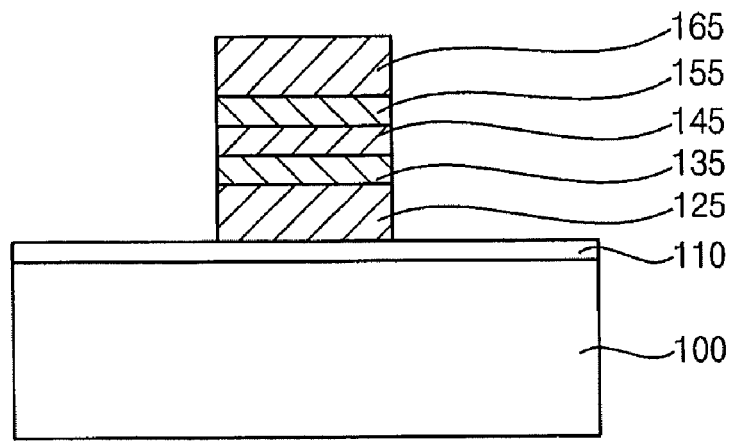

Referring to FIG. 13, the second conductive layer 160, the amorphous layer 150, the diffusion preventing layer 140, the metal ohmic layer 130 and the first conductive layer 120 are partially etched, so that a first conductive layer pattern 125, a metal ohmic layer pattern 135, a diffusion preventing layer pattern 145, an amorphous layer pattern 155 and a second conductive layer pattern 165 are sequentially formed on the gate insulation layer 110. In example embodiments, the second conductive layer 160, the amorphous layer 150, the diffusion preventing layer 140, the metal ohmic layer 130 and the first conductive layer 120 may be etched using a mask after the mask is provided on the second conductive layer 160. The mask may include nitride, oxynitride, photoresist, etc.

In some example embodiments, a spacer may be formed on sidewalls of the first conductive layer pattern 125, the metal ohmic layer pattern 135, the diffusion preventing layer pattern 145, the amorphous layer pattern 155 and the second conductive layer pattern 165. In the formation of the spacer, a spacer formation layer may be formed on the gate insulation layer 110 to cover the second conductive layer pattern 165. The spacer formation layer may be conformally formed along profiles of the first conductive layer pattern 125, the metal ohmic layer pattern 135, the diffusion preventing layer pattern 145, the amorphous layer pattern 155 and the second conductive layer pattern 165. The spacer formation layer may be formed using nitride or oxynitride by a CVD process, a PECVD process, etc. The spacer may be obtained by anisotropically etching the spacer formation layer.

As the formation of the second conductive layer pattern 165, the gate structure is provided on the substrate 100. As described above, the gate structure having enhanced electrical characteristics may be obtained by simplified processes.

Figure 14:
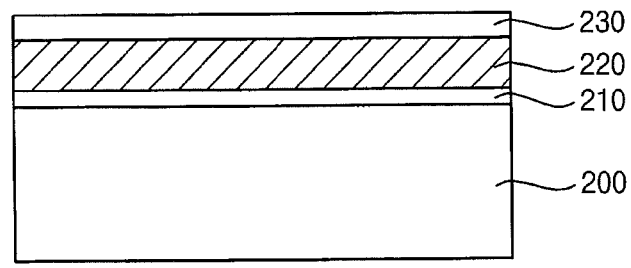
Figure 15:
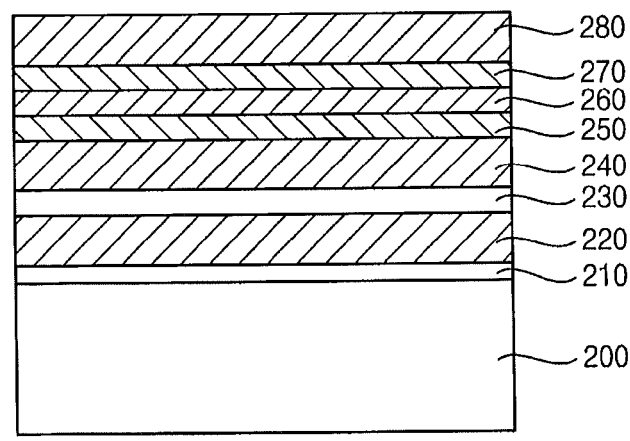
Figure 16:
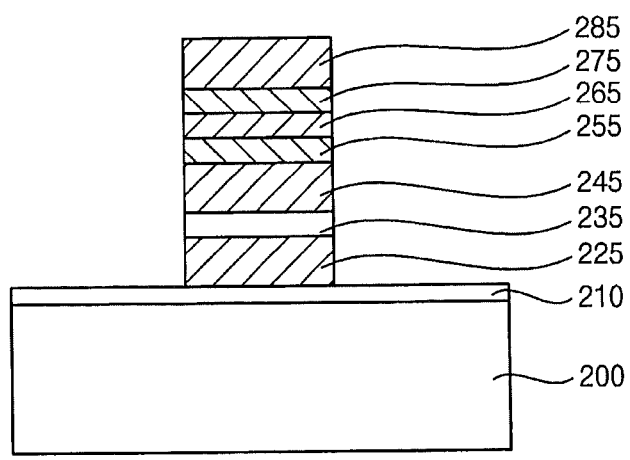

FIGS. 14 to 16 are cross-sectional views illustrating another method of manufacturing a gate structure in accordance with example embodiments.

Referring to FIG. 14, a tunnel insulation layer 210, a lower conductive layer 220 and a dielectric layer 230 are formed on a substrate 200.

The tunnel insulation layer 210 may be formed using oxide, oxynitride or low dielectric material by a thermal oxidation process, a CVD process, an ALD process, a PECVD process, a sputtering process, etc. For example, the tunnel insulation layer 210 may be formed using silicon oxide, silicon oxynitride, silicate, organic silicate, etc.

The lower conductive layer 220 may be formed by a CVD process, a PECVD process, an ALD process, a sputtering process, an evaporation process, etc. Further, the lower conductive layer 220 may be formed using polysilicon, metal or metal compound having a high work function. For example, the lower conductive layer 220 may be formed using polysilicon doped with impurities, tungsten, titanium, cobalt, nickel, tungsten silicide, tungsten nitride, titanium silicide, titanium nitride, cobalt silicide, nickel silicide, etc.

The dielectric layer 230 may be formed on the lower conductive layer 220 by a CVD process, a PECVD process, a sputtering process, a PLD process, an ALD process, etc. The dielectric layer 230 may be formed using oxide, nitride and/or metal oxide having a high dielectric constant. For example, the dielectric layer 230 may be formed using silicon oxide, silicon nitride, hafnium oxide, aluminum oxide, tantalum oxide, zirconium oxide, etc.

In some example embodiments, the dielectric layer 230 may be formed to have a multi layer structure. For example, a lower oxide film, a nitride film and an upper oxide film may be sequentially formed on the lower electrode layer 220, such that the dielectric layer 230 may be provided.

Referring to FIG. 15, a control gate layer is formed on the dielectric layer 230. The control gate layer includes a first conductive film 240, a metal ohmic film 250, a diffusion preventing film 260, an amorphous film 270 and a second conductive film 280 sequentially formed on the dielectric layer 230. Here, the first conductive film 240, the metal ohmic film 250, the diffusion preventing film 260, the amorphous film 270 and the second conductive film 280 may be formed by processes substantially the same as or substantially similar to the processes described with reference to FIGS. 9 to 12.

In some example embodiments, impurities may be doped into the amorphous film 270 to improve amorphous characteristics of the amorphous film 270. Here, the impurities may include elements having relatively high molecular weights, for example, argon, neon, nitrogen, etc.

Referring to the FIG. 16, the second conductive film 280, the amorphous film 270, the diffusion preventing film 260, the metal ohmic film 250, the first conductive film 240, the dielectric layer 230 and the lower conductive layer 220 are partially etched, such that a floating gate 225, a dielectric layer pattern 235, a first conductive film pattern 245, a metal ohmic film pattern 255, a diffusion preventing film pattern 265, an amorphous film pattern 275 and a second conductive film pattern 285 are successively formed on the tunnel insulation layer 210. In example embodiments, the floating gate 225, the dielectric layer pattern 235, the first conductive film pattern 245, the metal ohmic film pattern 255, the diffusion preventing film pattern 265, the amorphous film pattern 275 and the second conductive film pattern 285 may be formed by patterning the lower conductive layer 220, the dielectric layer 230, the first conductive film 240, the metal ohmic film 250, the diffusion preventing film 260, the amorphous film 270, and the second conductive film 280 using a mask provided on the second conductive film 280. Here, the mask may include nitride, oxynitride, photoresist, etc.

In accordance with the formations of the floating gate 225, the dielectric layer pattern 235, the first conductive film pattern 245, the metal ohmic film pattern 255, the diffusion preventing film pattern 265, the amorphous film pattern 275 and the second conductive film pattern 285, the gate structure is provided on the substrate 200.

According to example embodiments, the gate structure may ensure enhanced electrical characteristics because the gate structure has a low sheet resistance and uniform interfaces among the metal ohmic film pattern 255, the diffusion preventing film pattern 265, the amorphous film pattern 275 and the second conductive film pattern 285 without generating the agglomeration of silicon nitride.

Figure 17:
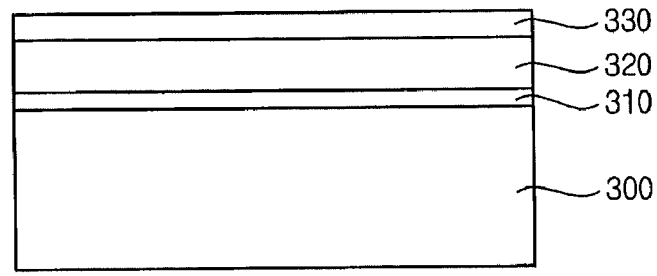
Figure 18:
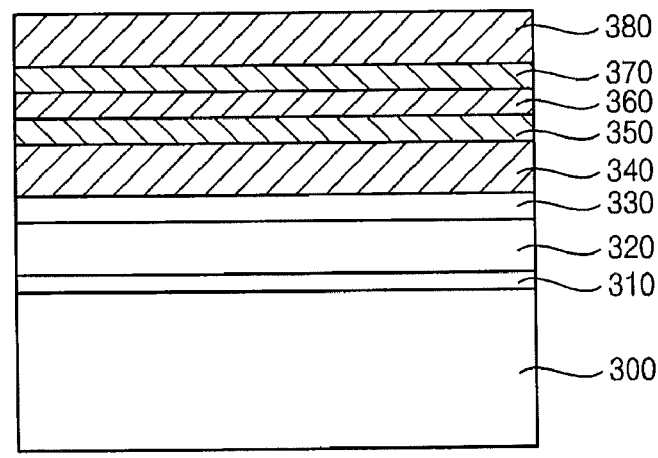
Figure 19:
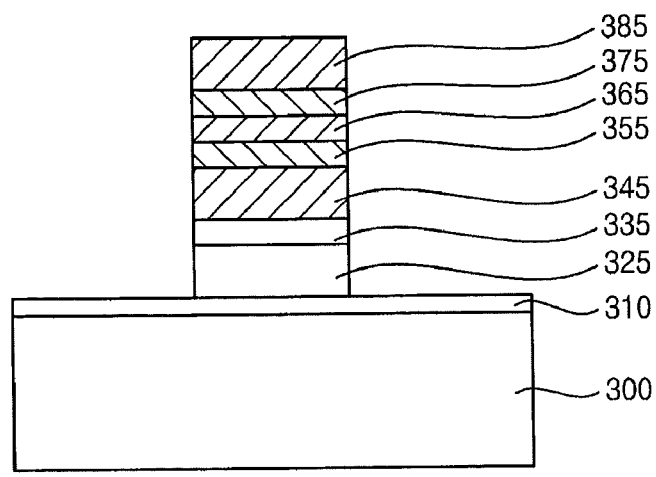

FIGS. 17 to 19 are cross-sectional views illustrating still another method of manufacturing a gate structure in accordance with example embodiments.

Referring to FIG. 17, a tunnel insulation layer 310, a charge trapping layer 320 and a blocking layer 330 are sequentially formed on a substrate 300.

The tunnel insulation layer 310 may be formed by a process substantially the same as or substantially similar to the process for forming the tunnel insulation layer 210 described with reference to FIG. 14.

The charge trapping layer 320 may be formed by a CVD process, a PECVD process, an ALD process, a sputtering process, an evaporation process, etc. The charge trapping layer 320 may be formed using nitride such as silicon nitride. Alternatively, the charge trapping layer 320 may be formed using at least one oxide film and at least one nitride film. For example, the charge trapping layer 320 may have a multi layer structure that includes an oxide film and a nitride film sequentially formed on the tunnel insulation layer 310. Alternatively, the charge trapping layer 320 may have another multi layer structure that includes a lower nitride film, an oxide film and an upper nitride film successively formed on the tunnel insulation layer 310.

The blocking layer 330 may be formed using oxide by a CVD process, a PECVD process, an LPCVD process, etc. For example, the blocking layer 330 may include silicon oxide. Alternatively, the blocking layer 330 may be formed using metal oxide having a high dielectric constant, for example, hafnium oxide, titanium oxide, tantalum oxide, zirconium oxide, aluminum oxide, etc. Here, the blocking layer 330 may be formed by a CVD process, a PECVD process, an ALD process, a sputtering process, a PLD process, an evaporation process, etc.

Referring to FIG. 18, a gate electrode layer is formed on the blocking layer 330. The gate electrode layer may include a first conductive film 340, a metal ohmic film 350, a diffusion preventing film 360, an amorphous film 370 and a second conductive film 380 successively formed on the blocking layer 330. Here, the first conductive film 340, the metal ohmic film 350, the diffusion preventing film 360, the amorphous film 370 and the second conductive film 380 may be formed by processes substantially the same as or substantially similar to the processes for forming the first conductive layer 120, the metal ohmic layer 130, the diffusion preventing layer 140, the amorphous layer 150 and the second conductive layer 160 described with reference to FIGS. 9 to 12.

Referring to the FIG. 19, the second conductive film 380, the amorphous film 370, the diffusion preventing film 360, the metal ohmic film 350, the first conductive film 340, the blocking layer 330 and the charge trapping layer 320 are partially etched, to thereby form a charge trapping layer pattern 325, a blocking layer pattern 335, a first conductive film pattern 345, a metal ohmic film pattern 355, a diffusion preventing film pattern 365, the amorphous film pattern 375 and the second conductive film pattern 385 on the tunnel insulation layer 310.

In some example embodiments, a spacer may be formed on sidewalls of the charge trapping layer pattern 325, the blocking layer 335, the first conductive film pattern 345, the metal ohmic film pattern 355, the diffusion preventing film pattern 365, the amorphous film pattern 375 and the second conductive film pattern 385. The spacer may be formed using nitride or oxynitride. For example, the spacer may be formed using silicon nitride or silicon oxynitride. Further, the spacer may be obtained by an anisotropic etching process.

According to example embodiments, the gate structure may have a low sheet resistance and uniform interfaces among the film patterns in the gate structure without the agglomeration of nitride.

Figure 20:
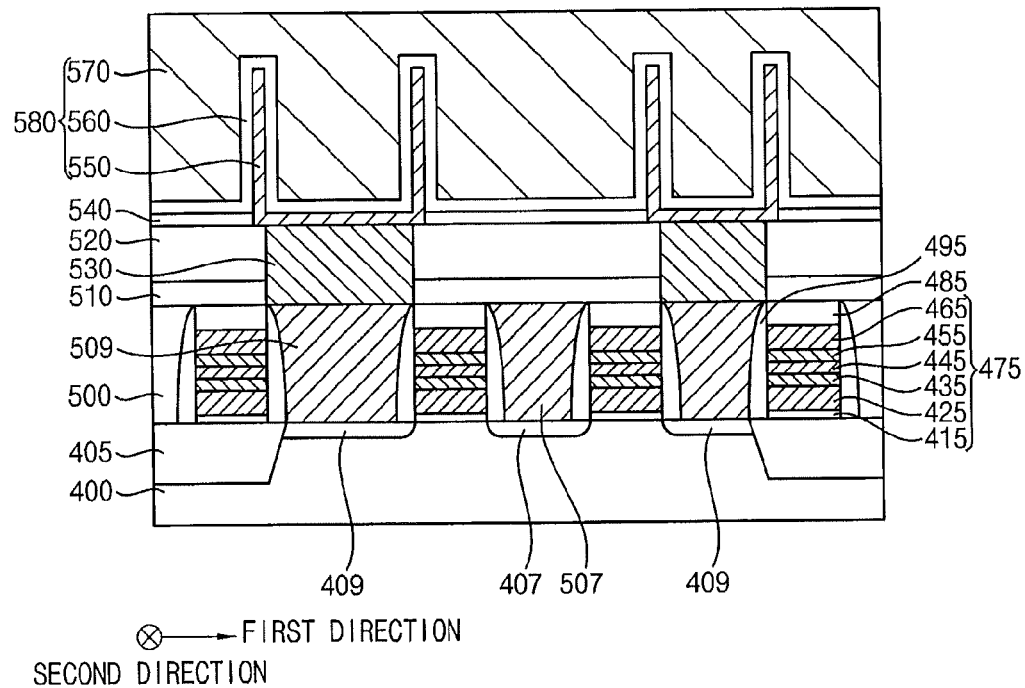

FIG. 20 is a cross-sectional view illustrating a volatile semiconductor device having a gate structure in accordance with example embodiments. Although a DRAM device is illustrated in FIG. 20, the gate structure may be employed in other volatile semiconductor devices, for example, SRAM devices.

Referring to FIG. 20, the semiconductor device includes a gate structure 475 provided on a substrate 400, a first impurity region 407, a second impurity region 409 and a capacitor 580.

An isolation layer 405 is positioned on the substrate 400 to define an active region and a field region. The isolation layer 405 may include oxide such as spin on glass (SOG), undoped silicate glass (USG), high density plasma-chemical vapor deposition (HDP-CVD) oxide, tetra ethyl ortho silicate (TEOS), plasma enhanced-TEOS (PE-TEOS), flowable oxide (FOX), tonen silazene (TOSZ), etc. The isolation layer 405 may be formed by a CVD process, a PECVD process, an HDP-CVD process, a spin coating process, etc.

The gate structure 475 includes a dielectric layer pattern 415, a first conductive layer pattern 425, a metal ohmic layer pattern 435, a diffusion preventing layer pattern 445, an amorphous layer pattern 455 and a second conductive layer pattern 465.

In example embodiments, a plurality of gate structures may be formed on the substrate 400 along a first direction whereas each of gate structures may extend in a second direction. Here, the second direction may be substantially perpendicular to the first direction.

A gate mask 485 is formed on the gate structure 475, and a spacer 495 is disposed on a sidewall of the gate structure 475 and the gate mask 485. The gate mask 485 may include a material that has an etching with respect to the gate structure 475. For example, the gate mask 485 may be formed using silicon nitride, silicon oxynitride, silicon oxide, etc. The spacer 495 may be formed using a material that also has an etching with respect to the gate structure 475. For example, the spacer 495 may be formed using silicon nitride, silicon oxynitride, etc.

The first and the second impurity regions 407 and 409 are positioned at portions of the substrate 400 adjacent to the gate structure 475. The first and the second impurity regions 407 and 409 may be formed by doping N type or P type impurities into the portions of the substrate 400. The first and the second impurity regions 407 and 409 may serve as a source region and a drain region in a transistor.

A first insulation layer 500 is formed on the substrate 400 to cover the gate structures 475. The first insulation layer 500 may include oxide such as silicon oxide. For example, the first insulation layer 500 may be formed using boro-phosphor silicate glass (BPSG), USG, SOG, TEOS, PE-TEOS, TOSZ, FOX, etc. The first insulation layer 500 may be planarized to have a level upper face. For example, the first insulation layer 500 may be partially removed by a chemical mechanical polishing (CMP) process and/or an etch-back process until the gate mask 485 is exposed.

A first contact 507 and a second contact 509 are formed on the first impurity region 407 and the second impurity region 409 through the first insulation layer 500. The first and the second contacts 507 and 509 may include metal, metal compound and/or doped polysilicon. For example, each of the first and the second contacts 507 and 509 may be formed using tungsten, tungsten nitride, aluminum, aluminum nitride, copper, titanium, titanium nitride, tantalum, tantalum nitride, etc. These may be used alone or in a mixture thereof.

A bit line (not illustrated) is disposed on the first insulation layer 500. The bit line makes contact with the first contact 507. The bit line may include metal, metal compound and/or doped polysilicon. For example, the bit line may be formed using tungsten, tungsten nitride, aluminum, aluminum nitride, copper, titanium, titanium nitride, tantalum, tantalum nitride, etc. In example embodiments, a plurality of bit lines may be formed along the second direction. Each of the bit line may have a multi layer structure that has a bit line electrode, a bit line mask and a bit line spacer.

A second insulation layer 510 is positioned on the first insulation layer 500 to cover the bit line. The second insulation layer 510 may include oxide such as BPSG, USG, TEOS, PE-TEOS, FOX, TOSZ, SOG, HDP-CVD oxide, etc. The second insulation layer 510 may be formed by a CVD process, a spin coating process, a PECVD process, an HDP-CVD process, etc. The second insulation layer 510 may be partially removed by a CMP process and/or an etch-back process until the bit line is exposed, so that the second insulation layer 510 may have a flat upper face.

A third insulation layer 520 is formed on the second insulation layer 510. The third insulation layer 520 may include oxide, for example, BPSG, FOX, USG, TEOS, PE-TEOS, TOSZ, SOG, HDP-CVD oxide, etc. Additionally, the third insulation layer 520 may be formed by a CVD process, a spin coating process, a PECVD process, an HDP-CVD process, etc.

A third contact 530 is disposed on the second contact 509 through the second insulation layer 510 and the third insulation layer 520. The third contact 530 may include metal, metal compound and/or doped polysilicon. For example, the third contact 530 may be formed using tungsten, tungsten nitride, aluminum, aluminum nitride, copper, titanium, titanium nitride, tantalum, tantalum nitride, etc. These may be used alone or in a mixture.

The capacitor 580 is positioned on the third insulation layer 520 to make contact with the third contact 530. The capacitor 580 includes a lower electrode 550, a dielectric layer 560 and an upper electrode 570. Each of the lower electrode 560 and the upper electrode 570 may include metal, metal compound and/or doped polysilicon. For example, each of the lower and the upper electrodes 550 and 560 may be formed using tungsten, tungsten nitride, tungsten silicide, aluminum, aluminum nitride, copper, titanium, titanium nitride, titanium silicide, tantalum, tantalum nitride, tantalum silicide, cobalt silicide, nickel silicide, etc. These may be used alone or in a mixture.

The dielectric layer 560 may be formed using oxide, nitride and/or metal compound having a high dielectric constant. For example, dielectric layer may include silicon oxide, silicon nitride, tantalum oxide, hafnium oxide, aluminum oxide, zirconium oxide, etc. Alternatively, the dielectric layer 560 may have a multi layer structure that includes at least one oxide film, at least one nitride film and/or at least one metal compound film.

In example embodiments, an etch stop layer 540 is provided on the third insulation layer 520. The etch stop layer 540 may be formed using nitride by a CVD process, a PECVD process, an LPCVD process, etc. For example, the etch stop layer 540 may include silicon nitride.

The gate structure 475 may be have a low sheet resistance and a good thermal stability, such that the volatile semiconductor device including the gate structure 475 may ensure a high response speed and an improved reliability. For example, the volatile semiconductor device including the gate structure 475 may have enhanced electrical characteristics when the volatile semiconductor device has a critical dimension below about 70 nanometers.

Figure 21:
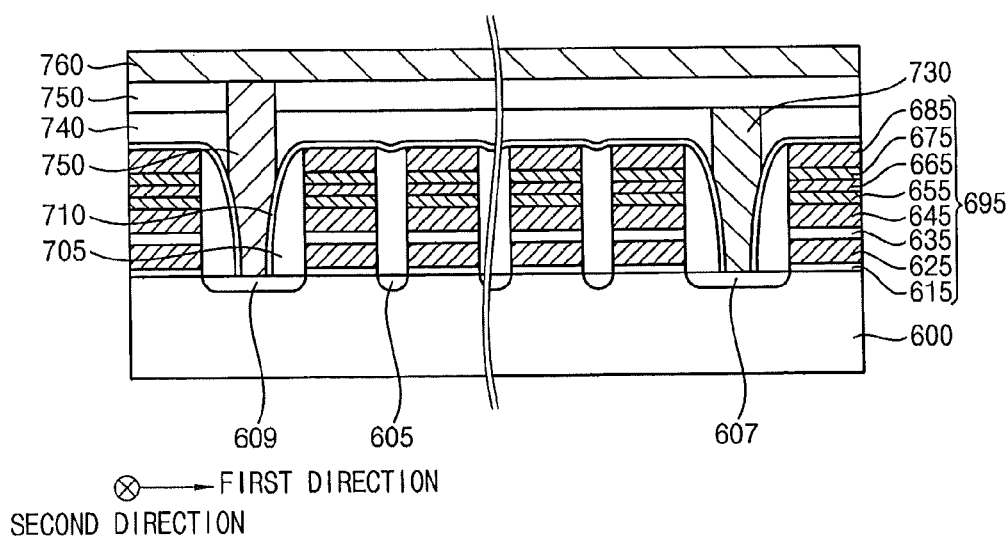

FIG. 21 is a cross-sectional view illustrating a non-volatile semiconductor device having a gate structure in accordance with example embodiments. FIG. 21 may illustrate a floating gate type flash memory device.

Referring to FIG. 21, the non-volatile semiconductor device includes a gate structure 695 provided on a substrate 600, a first impurity region 605, a second impurity region 607, a third impurity region 609, a common source line (CSL) 730, and a bit line 760.

The gate structure 695 has a tunnel insulation layer 615, a floating gate 625, a dielectric layer pattern 635, a first conductive polysilicon layer pattern 645, a metal ohmic layer pattern 655, a diffusion preventing layer pattern 665, an amorphous layer pattern 675 and a second conductive layer pattern 685. The gate structure 695 may extend in a second direction whereas a plurality of the gate structures may be formed along a first direction substantially perpendicular to the second direction. In example embodiments, the gate structures may serve as word lines, a string selection line (SSL) and a ground selection line (GSL) in the non-volatile semiconductor device.

A spacer 705 is formed a sidewall of the gate structure 695, and a protection layer 710 is positioned on the gate structure 795 and the spacer 705. Each of the spacer 705 and the protection layer 710 may include nitride, for example, silicon nitride.

The first to the third impurity regions 605, 607 and 609 be formed by doping N type or P type impurities into predetermined portions of the substrate 600. The first impurity region 605 may be disposed among the word lines, the SSL and the GSL in one string. The second and the third impurity regions 607 and 609 may be located between two strings.

A first insulation layer 740 is provided on the substrate 600 to cover the gate structure 695 and the protection layer 710. The first insulation layer 740 may be formed using oxide, for example, silicon oxide. The CSL 730 is formed on the second impurity region 607 through the first insulation layer 740. The CSL 730 may include metal, metal compound and/or doped polysilicon.

A second insulation layer 750 is positioned on the first insulation layer 740 and the GSL 730. The second insulation layer 750 may include oxide such as BPSG, USG, SOG, TEOS, PE-TEOS, FOX, TOSZ, HDP-CVD oxide, etc.

A bit line contact 750 is formed on the second impurity region 607 through the first and the second insulation layers 740 and 750. The bit line contact 750 may include metal, metal compound and/or doped polysilicon. For example, the bit line contact 750 may be formed using tungsten, tungsten nitride, tungsten silicide, aluminum, aluminum nitride, copper, titanium, titanium nitride, titanium silicide, tantalum, tantalum nitride, tantalum silicide, cobalt silicide, nickel silicide, etc. These may be used alone or in a mixture.

The bit line 760 is disposed on the second insulation layer 750 to make contact with the bit line contact 750. The bit line 760 may extend along the first direction. The bit line 760 may include metal, metal compound and/or doped polysilicon.

Since the gate structure 695 may have a low sheet resistance and a desired thermal stability, so that the non-volatile semiconductor device including the gate structure 695 may ensure enhanced electrical characteristics such as a high response speed, an improved reliability, a low operation power, etc.

Figure 2:
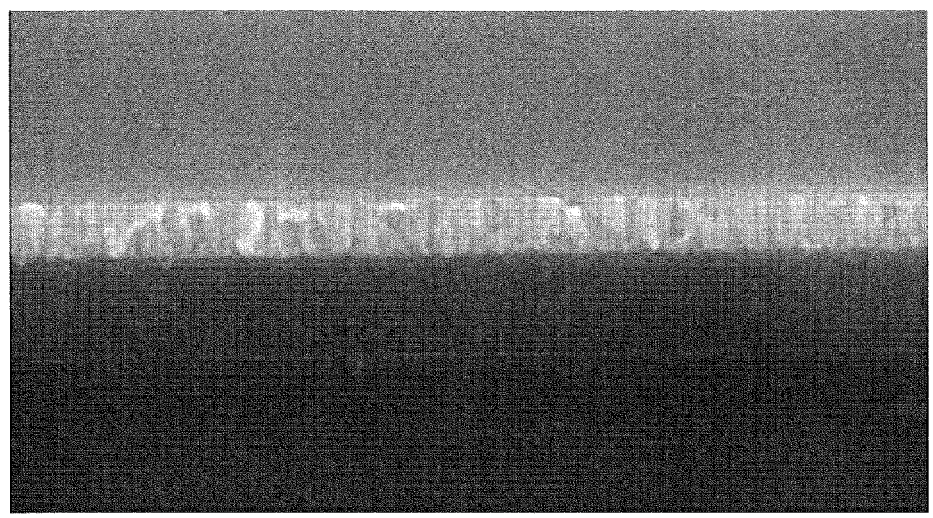
Figure 22:
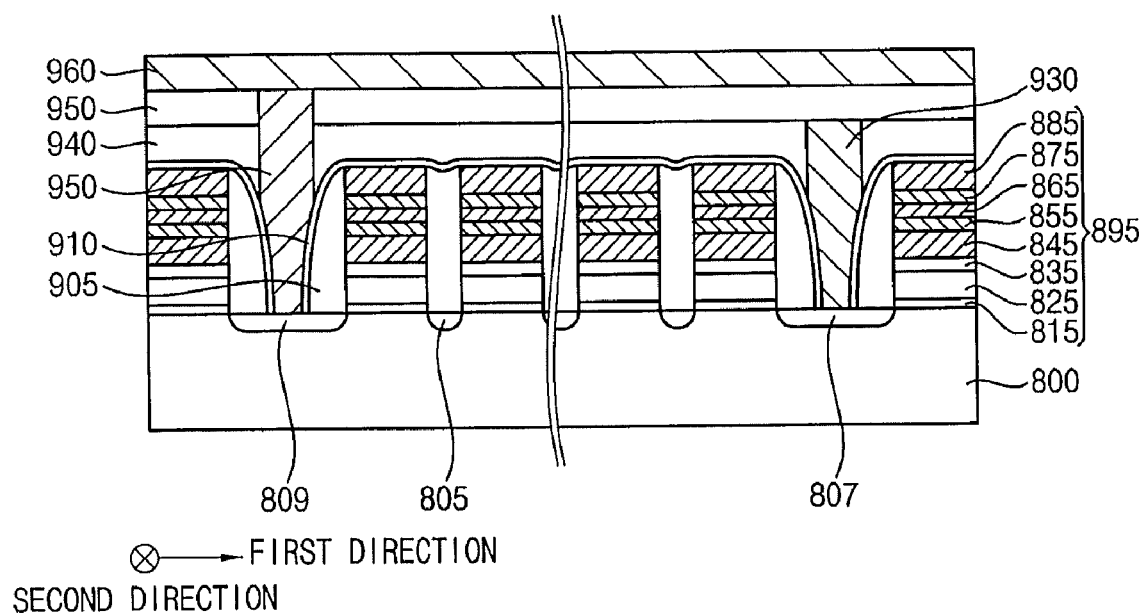

FIG. 22 is a cross-sectional view illustrating another non-volatile semiconductor device having a gate structure in accordance with example embodiments. FIG. 2 may illustrate a charge trapping type flash memory device.

Referring to FIG. 22, the non-volatile semiconductor device includes a gate structure 895 provided on a substrate 800, a first impurity region 805, a second impurity region 807, a third impurity region 809, a common source line (CSL) 930, and a bit line 960.

The gate structure 895 includes a tunnel insulation layer 815, a floating gate 825, a dielectric layer pattern 835, a first conductive layer pattern 845, a metal ohmic layer pattern 855, a diffusion preventing layer pattern 865, an amorphous layer pattern 875, and a second conductive layer pattern 885.

A spacer 905 is additionally provided on a sidewall of the gate structure 895, and a protection layer 910 is formed on the gate structure 895 and the spacer 905. A first insulation layer 940, a second insulation layer 950 and a bit line contact 950 are formed on the substrate 800, the gate structure 895 and the protection layer 910.

In example embodiments, a plurality of the gate structure may be formed in a cell area of the non-volatile semiconductor device, and may be disposed in a peripheral high voltage area of the non-volatile semiconductor device.

Figure 23:
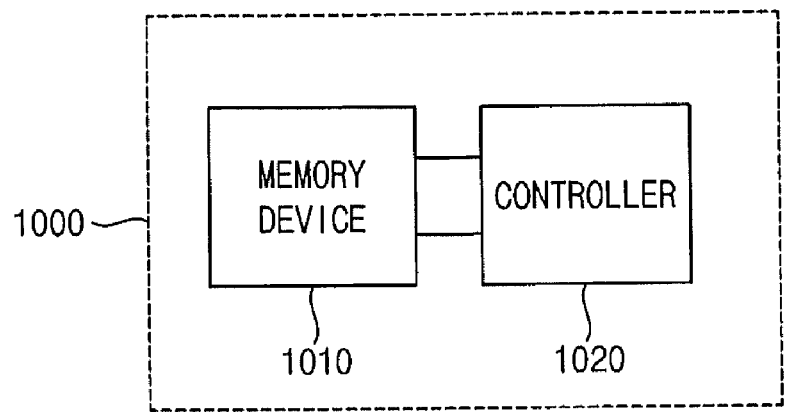
FIG. 23 is a block diagram illustrating a memory system including a gate structure in accordance with example embodiments.

FIG. 23 is a block diagram illustrating a memory system including a gate structure in accordance with example embodiments.

Referring to FIG. 23, a memory system 1000 may include a memory device 1010 and a controller 1020 electrically connected to the memory device 1010.

The memory device 1010 may include a volatile semiconductor device having the gate structure according to example embodiments and/or the non-volatile semiconductor device including the gate structure according to example embodiments. The non-volatile semiconductor device may include a NAND type flash memory device or a NOR type flash memory device.

The controller 1020 may provide an input signal to control an operation of the memory device 1010. When the controller 1020 is employed in the NAND type flash memory device illustrated in FIGS. 21 and 22, the controller 1020 may provide command signals (CMD) and address signals (ADD). When the controller 1020 is used in the NOR type flash memory device, the controller 1020 may provide command signals, address signals, input/output signals (DQ) and high voltages (VPP). That is, the controller 1020 may provide various signals to control the memory device 1010.

Figure 24:
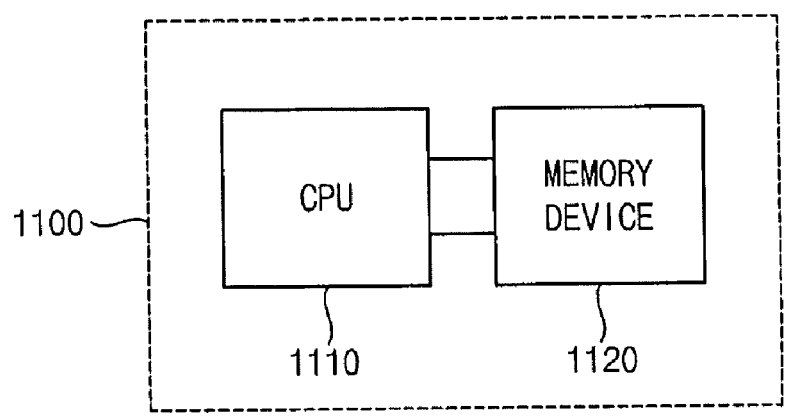
FIG. 24 is a block diagram illustrating a computer system including a gate structure in accordance with example embodiments.

FIG. 24 is a block diagram illustrating a computer system including a gate structure in accordance with example embodiments.

Referring to FIG. 24, a computer system 1100 may include a memory device 1120 and a central processing unit (CPU) 1110 electrically connected to the memory device 1120. For example, the computer system 1100 may include a personal computer or a personal data assistance. The memory device 1120 may be connected with the CPU 1110 directly or through a BUS.

According to example embodiments, a gate structure may include an amorphous layer pattern between an upper conductive layer pattern and a diffusion preventing layer pattern. Thus, the gate structure may have a low sheet resistance and a uniform interface between the upper conductive layer pattern and the diffusion preventing layer pattern. When the gate structure is employed in a semiconductor device, the semiconductor device may have desired electric characteristics, for example, a high response speed, an improved reliability, a lower power consumption, etc. Further, the metal ohmic layer pattern includes metal having a high melting point and has a desired thickness, so that the gate structure may ensure excellent thermal and electrical stabilities.

The foregoing is illustrative of example embodiments and is not to be construed as limiting thereof Although a few example embodiments have been described, those skilled in the art will readily appreciate that many modifications are possible in the example embodiments without materially departing from the novel teachings and advantages of the invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a gate structure, comprising:
    forming a tunnel insulation layer on a substrate;
    forming a floating gate on the tunnel insulation layer;
    forming a dielectric layer pattern on the floating gate; and
    forming a control gate on the dielectric layer pattern by
        forming a first conductive layer pattern on the dielectric layer pattern, forming a metal ohmic layer pattern on the first conductive layer pattern, forming a diffusion preventing layer pattern on the metal ohmic layer pattern, forming an amorphous layer pattern on the diffusion preventing layer pattern, and forming a second conductive layer pattern on the amorphous layer pattern,
    wherein forming the floating gate further comprises:
        forming an additional first conductive layer pattern on the tunnel insulation layer;
        forming an additional metal ohmic layer pattern on the additional first conductive layer pattern;
        forming an additional diffusion preventing layer pattern on the additional metal ohmic layer pattern;
        forming an additional amorphous layer pattern on the additional diffusion preventing layer pattern; and
        forming an additional second conductive layer pattern on the additional amorphous layer pattern.

2. The method of claim 1, wherein the second conductive layer pattern is formed using tungsten, the amorphous layer pattern is formed using tungsten silicide, the diffusion preventing layer pattern is formed using tungsten nitride, and the metal ohmic layer pattern is formed using titanium.

3. The method of claim 2, wherein the additional first conductive layer pattern is formed using polysilicon, the additional second conductive layer pattern is formed using tungsten, the additional amorphous layer pattern is formed using tungsten silicide, and the additional diffusion preventing layer pattern is formed using tungsten nitride.

* * * * *